(12) United States Patent
Eichler et al.

(10) Patent No.: US 7,885,306 B2
(45) Date of Patent: Feb. 8, 2011

(54) EDGE-EMITTING SEMICONDUCTOR LASER CHIP

(75) Inventors: Christoph Eichler, Tegernheim (DE); Volker Härle, Laaber (DE); Christian Rumbolz, Lappersdorf (DE); Uwe Strauss, Bad Abbach (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 7 days.

(21) Appl. No.: 11/824,877

(22) Filed: Jul. 2, 2007

(65) Prior Publication Data

US 2008/0049801 A1 Feb. 28, 2008

Related U.S. Application Data

(60) Provisional application No. 60/876,089, filed on Dec. 20, 2006.

(30) Foreign Application Priority Data

Jun. 30, 2006 (DE) ........................ 10 2006 030 251

(51) Int. Cl.
*H01S 5/00* (2006.01)
(52) U.S. Cl. .................................. 372/45.01; 372/43.01
(58) Field of Classification Search ............... 372/45.01
See application file for complete search history.

(56) References Cited

U.S. PATENT DOCUMENTS

| 5,488,678 A * | 1/1996 | Taneya et al. ................... 385/14 |
| 5,889,295 A | 3/1999 | Rennie et al. |
| 6,154,475 A * | 11/2000 | Soref et al. ............. 372/45.011 |
| 6,562,648 B1 | 5/2003 | Wong et al. |
| 2002/0094002 A1 | 7/2002 | Amano et al. |
| 2003/0119217 A1 | 6/2003 | Ploessl et al. |
| 2004/0033638 A1 | 2/2004 | Bader et al. |
| 2004/0184497 A1 | 9/2004 | Kneissl et al. |
| 2004/0252738 A1 * | 12/2004 | Hill .............................. 372/43 |
| 2005/0104083 A1 | 5/2005 | Bader et al. |
| 2005/0279994 A1 * | 12/2005 | Ueda et al. ..................... 257/33 |
| 2006/0121702 A1 | 6/2006 | Coman et al. |
| 2006/0211159 A1 | 9/2006 | Bruederl et al. |
| 2006/0222036 A1 * | 10/2006 | Yamaguchi et al. ........... 372/66 |

FOREIGN PATENT DOCUMENTS

| EP | 1460741 A | 9/2004 |
| JP | 2000106473 A | 4/2000 |

(Continued)

OTHER PUBLICATIONS

Ruan et al. ("Stimulated emission in nanocrystalline silicon superlattices", Applied Physics Letters, vol. 83, No. 26, Dec. 29, 2003, pp. 5479-5481).*

(Continued)

*Primary Examiner*—Tod T Van Roy
(74) *Attorney, Agent, or Firm*—Cohen Pontani Lieberman & Pavane LLP

(57) ABSTRACT

What is specified is an edge emitting semiconductor laser chip comprising
a carrier substrate (1),
an interlayer (2) promoting adhesion between the carrier substrate (1) and a component structure (50) of the edge emitting semiconductor laser chip, and
the component structure (50) comprising an active zone (5) provided for generating radiation.

8 Claims, 6 Drawing Sheets

FOREIGN PATENT DOCUMENTS

| | | |
|---|---|---|
| WO | WO 2005/004231 A | 1/2005 |
| WO | WO 2005/004231 A1 | 1/2005 |
| WO | WO 2007/025497 A1 | 3/2007 |

OTHER PUBLICATIONS

S. Nakamura et al., "High-Power, Long-Lifetime InGaN/GaN/AlGaN-Based Laser Diodes Grown on Pure GaN Substrates", Japanese Journal of Applied Physics, Japan Society of Applied Physics, Tokyo, Japan , vol. 37, Pt. 2, No. 3B, pp. L309-L312, Mar. 1998.

S. Nakamura et al., "InGaN/GaN/AlGaN-based laser diodes with cleaved facets grown on GaN substrates", Applied Physics Letters, vol. 73, No. 6, Aug. 10, 1998, pp. 832-834.

T. Asano, et al., "Over 100-mW blue-violet laser diodes for Blu-ray Disc system", Proceedings of SPIE vol. 5365 (SPIE, Bellingham, WA, 2004), pp. 297-305.

* cited by examiner

EDGE-EMITTING SEMICONDUCTOR LASER CHIP

RELATED APPLICATIONS

This patent application claims the priority of German patent application 10 2006 03 0251.6 filed Jun. 30, 2006 and U.S. provisional patent application 60/876,089 filed Dec. 20, 2006, the disclosure content of both of which is hereby incorporated by reference.

FIELD OF THE INVENTION

The present invention is related to an edge emitting semiconductor laser chip.

BACKGROUND AND SUMMARY OF THE INVENTION

One object of the present invention is to provide an improved edge emitting semiconductor laser chip. A further object is to improve the strains and the wave-guiding in a semiconductor laser.

In accordance with at least one embodiment of the edge emitting semiconductor laser chip, the edge emitting semiconductor laser chip comprises a carrier substrate.

In accordance with at least one embodiment of the edge emitting semiconductor laser chip, the edge emitting semiconductor laser chip furthermore comprises an interlayer promoting adhesion between the carrier substrate and a component structure of the edge emitting semiconductor laser chip.

By way of example, the carrier substrate is mechanically fixed to a useful layer made of semiconductor material by means of the interlayer. The useful layer is preferably distinguished by a low dislocation density. That surface of the semiconductor layer which is remote from the carrier substrate then serves as growth area for epitaxially produced semiconductor layers—for example the component structure of the edge emitting semiconductor laser chip. It is furthermore possible for the carrier substrate to be bonded directly onto the epitaxially grown component structure of the edge emitting semiconductor laser chip by means of the interlayer.

In accordance with at least one embodiment of the edge emitting semiconductor laser chip, the component structure comprises an active zone provided for generating radiation. That is to say that when the edge emitting semiconductor laser chip is energized, electromagnetic radiation is generated and/or amplified in said active zone, which radiation then leaves the edge emitting semiconductor laser chip as laser radiation.

In accordance with at least one embodiment of the edge emitting semiconductor laser chip, the edge emitting semiconductor laser chip comprises a carrier substrate and an interlayer promoting adhesion between the carrier substrate and a component structure of the edge emitting semiconductor laser chip, wherein the component structure comprises an active zone provided for generating radiation.

In accordance with at least one embodiment of the edge emitting semiconductor laser chip, the interlayer forms at least one part of a cladding layer of the edge emitting semiconductor laser chip. For this purpose, the interlayer has for example a significantly lower refractive index than the semiconductor material surrounding it. On account of the low refractive index of the interlayer, the optical wave generated in the semiconductor laser chip is shielded from the carrier substrate and also from layers lying between carrier substrate and interlayer, whereby so-called substrate modes—that is to say the penetration of the optical wave into the substrate—are effectively prevented. By virtue of the fact that the interlayer forms a part of the cladding layer of the edge emitting semiconductor laser chip, the thickness of an epitaxially grown cladding layer can be reduced.

In nitride-based laser diodes, for example, use is made of the materials InGaN for the active zone, GaN for the waveguide, the contact layer and the substrate, and AlGaN for the cladding layers. These materials have a different lattice constant in the unstrained state. This results in strains in the layer system. These strains in the layer system restrict the laser properties and possible growth parameters. The further the emission wavelength is shifted from approximately 405 nm—that is to say a little amount of indium in the active zone and a little amount of aluminum in the cladding layers—in the direction of blue or green (i.e. to wavelengths which are greater than 405 nm, the more indium is required in the active zone in order to set the emission wavelength. Since the refractive index contrast between GaN and AlGaN also decreases, however, as the wavelength increases, a higher aluminum proportion and/or a larger layer thickness is simultaneously required for comparably good wave-guiding. The lattice mismatch between AlGaN cladding layer and active zone—InGaN—is thus increasingly intensified with longer wavelength, whereby severe strains form in the material and limit the material quality. The same problem also arises analogously for short-wave lasers with an emission wavelength <405 nm. In particular for wavelengths <360 nm, it furthermore holds true that GaN contained in the laser structure absorbs greatly in this wavelength range. Therefore, defect-reduced AlGaN substrates are required for achieving high lifetimes. One possibility consists in growing the laser diodes on defect-reduced GaN, this being suitable with regard to the lattice constant primarily for low aluminum- and indium-containing layers. Thick cladding layers are particularly well suited to reducing the substrate mode. At long wavelengths, the required cladding thickness increases greatly and the filling factor in the active zone decreases.

The edge emitting semiconductor laser chip described here makes it possible, inter alia, for the substrate lattice constant to be set in a targeted manner. Furthermore, the edge emitting semiconductor laser chip enables for the first time, for lattice-matched epitaxy on low-defect substrates, inter alia, a reduction of the required cladding thickness and an increased filling factor in the active zone in conjunction with an improved strain balance of the active zone.

In accordance with at least one embodiment of the edge emitting semiconductor laser chip, the interlayer forms a cladding layer of the edge emitting semiconductor laser chip. This embodiment of the edge emitting semiconductor laser chip completely dispenses with an epitaxially grown cladding layer on that side of the active zone which faces the interlayer. The interlayer here performs the task of the cladding layer. By virtue of the preferably great jump in refractive index between the interlayer and the waveguide of the semiconductor laser which faces the interlayer, the optical wave generated in the semiconductor laser is guided to a very great extent, whereby the filling factor in the active zone can advantageously be increased.

In accordance with at least one embodiment of the edge emitting semiconductor laser chip, the interlayer is electrically insulating. In this case, the interlayer preferably contains a silicon nitride and/or a silicon oxide. In this case, the interlayer may for example contain one of the following materials or comprise one of the following materials: $SiO_2$, $Si_3N_4$.

In accordance with at least one embodiment of the edge emitting semiconductor laser chip, the interlayer provides an electrical contact between the carrier substrate and the active zone. That is to say that the interlayer is electrically conductive. On the p-side, for example, an electric current is impressed into the active zone of the edge emitting semiconductor laser chip via the interlayer. By way of example, the interlayer may in this case be formed from a transparent conductive oxide (TCO) such as ITO (indium tin oxide), for example, or contain this material.

In accordance with at least one embodiment of the edge emitting semiconductor laser chip, the interlayer promotes adhesion between the carrier substrate and a useful layer, wherein at least one part of the component structure is deposited epitaxially onto that side of the useful layer which is remote from the interlayer. In this case, the carrier substrate may be for example a GaN carrier substrate that is cost-effective since it is high in defects. The carrier substrate is connected to the useful layer by means of the interlayer, which useful layer may be for example an epitaxially grown layer sequence that is low in defects and dislocations. At least one part of the component structure is deposited epitaxially onto this useful layer, which can then itself perform functional tasks in the edge emitting semiconductor laser chip.

In accordance with at least one embodiment of the edge emitting semiconductor laser chip, the useful layer forms at least one part of a cladding layer or of a waveguide layer of the edge emitting semiconductor laser chip. This means that in the edge emitting semiconductor laser chip the useful layer performs the task of a cladding layer or of a waveguide layer. These layers or at least parts of these layers are then not produced together epitaxially with the remaining layers of the component structure, rather the component structure is applied, for example deposited epitaxially, onto these layers.

In accordance with at least one embodiment of the edge emitting semiconductor laser chip, the interlayer is a bonding layer. That is to say that the interlayer serves for bonding the carrier substrate to the useful layer or directly to the component structure. By way of example for this purpose, the interlayer contains or consists of at least one of the following materials: $SiO_2$, $Si_3N_4$, SiN, ITO, $Al_2O_3$, $Ta_2O_5$, $HfO_2$, ZnO.

In accordance with at least one embodiment of the edge emitting semiconductor laser chip, the refractive index of the material from which the interlayer is formed is less than the refractive index of the material from which the useful layer is formed. In this way, a jump in refractive index occurs between useful layer and interlayer, and, as described further above, can wholly or at least partly prevent the optical wave generated in the semiconductor laser chip from penetrating into the carrier substrate.

In accordance with at least one embodiment of the edge emitting semiconductor laser chip, the edge emitting semiconductor laser chip comprises two interlayers, wherein the active zone is arranged between the two interlayers. That is to say that an interlayer is arranged both at the p-siden-side and at the p-side of the edge emitting semiconductor laser chip, said interlayer forming a bonding layer for example. Preferably, the interlayers in this case are electrically conductive and serve for impressing a current into the active zone on the n-side and p-side.

In accordance with at least one embodiment of the edge emitting semiconductor laser chip, a material which is electrically insulating and/or has a smaller refractive index than the interlayer is partly arranged between the interlayer and the useful layer, or between the interlayer and the component structure. An index-guided edge emitting semiconductor laser chip, for example, is realized in this way.

In other words, the edge emitting semiconductor laser described here makes use of the following considerations, inter alia: an interlayer having a low refractive index, e.g. $SiO_2$, $Si_3N_4$, ITO, is inserted into the laser structure. At the same time, the defect density of the epitaxial layers is kept low. For this purpose, by way of example, the laser structure is grown onto a useful layer with a low dislocation density, which is produced by a lateral cleave process. In this case, for bonding the useful layer onto the carrier, use is made of the interlayer having a significantly lower refractive index than GaN—for example $SiO_2$, SiN, $Si_3N_4$, ITO—, which, in the edge emitting semiconductor laser chip, simultaneously acts as a cladding layer or at least as part thereof. On account of the low refractive index of the interlayer, in this case the optical wave is shielded from the underlying material—that is to say the carrier substrate for example, whereby a substrate mode is effectively prevented. In this case, the remaining cladding thickness directly above the interlayer can be chosen so as to set an optimum between optical and electrical properties. Thus, for better transverse conductivity, for example, a certain cladding thickness can remain above the interlayer. For the case of vertical current transport through the component for example with an ITO interlayer, it is possible to use a residual cladding layer thickness to prevent possible absorptions at the interlayer. However, the residual cladding layer can also be entirely omitted. In this case, the interlayer acts directly as a cladding layer, the optical wave being guided to a very great extent on account of the great jump in refractive index with respect to the waveguide, whereby the filling factor in the active zone can be increased. In this case, by virtue of the different possible cladding thicknesses, it is possible to set the strain in the active zone in a targeted manner, for example it is possible to set the strain without AlGaN cladding layer to relaxed GaN. Accordingly, a relaxed AlGaN substrate can be produced for UV lasers, and an indium-containing substrate can be produced for long-wave lasers.

The optimum between optical properties and good bondability can furthermore be set by using a plurality of layers, for example thin $SiO_2$ for good bondability at the semiconductor interface, followed by a silicon nitride layer having a higher refractive index for matched wave-guiding.

DETAILED DESCRIPTION OF THE DRAWINGS

In the exemplary embodiments and figures, identical or identically acting constituent parts are in each case provided with the same reference symbols. The elements illustrated should not be regarded as true to scale, rather individual elements may be illustrated with an exaggerated size for the sake of better understanding.

Figure 1A:
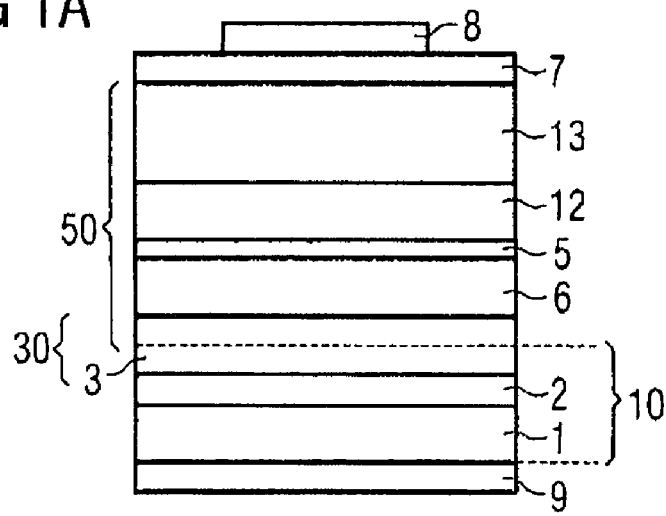
FIG. 1A shows a schematic sectional illustration of an edge emitting semiconductor laser chip in accordance with a first exemplary embodiment.

FIG. 1A shows a schematic sectional illustration of an edge emitting semiconductor laser chip in accordance with a first exemplary embodiment.

The edge emitting semiconductor laser chip in accordance with the embodiment of FIG. 1A is a broad-stripe laser. The semiconductor laser chip comprises a carrier substrate 1. In the present exemplary embodiment, the carrier substrate 1 is a cost-effective, high-defect GaN carrier substrate.

The semiconductor laser chip furthermore comprises an interlayer 2. The interlayer 2 is a bonding layer that provides a mechanical connection between the carrier substrate 1 and a useful layer 3. The useful layer 3 is for example an epitaxially grown layer which contains or consists of InGaN. For production, a strained epitaxial layer made of or comprising InGaN is deposited for this purpose for example first on a high-quality, low-dislocation, expensive GaN mother substrate. The interlayer 2 is subsequently applied to that side of the epitaxial layer which is remote from the mother substrate. By means of a so-called "lateral cleave" process—for example by implantation of hydrogen—the epitaxial layer is subsequently stripped from the mother substrate and forms the useful layer 3. Such a method for producing a quasi substrate with useful layer is described for example in published US Patent Application No. 2006/0211159A1, the disclosure content of which is in this regard hereby expressly incorporated by reference.

In the exemplary embodiment described in conjunction with FIG. 1A, the interlayer 2 is electrically conductive and comprises or consists of ITO, for example.

The component structure 50 of the semiconductor laser is deposited epitaxially on the useful layer 3. The component structure 50 comprises for example an n-side waveguide layer 6, an active zone 5, which may contain single or multiple quantum well structures, barrier layers and also spacer layers, which is applied to the n-side waveguide layer 6.

A p-side waveguide layer 12 is deposited onto that side of the active zone 5 which is remote from the n-side waveguide layer 6. The p-side waveguide layer 12 is then followed by a p-side cladding layer 13 in the growth direction. A p-side contact layer 7 is epitaxially grown or applied onto the p-side cladding layer 13. The edge emitting semiconductor laser chip furthermore has a p-contact 8 and an n-contact 9.

As shown in FIG. 1A, a material having the same composition as the useful layer 3 can be deposited epitaxially between the n-side waveguide layer 6 and the useful layer 3. The layer produced in this way forms together with the useful layer 3 the n-side cladding layer 30 or a part of said cladding layer. However, it is also possible for the n-side waveguide layer 6 to be epitaxially coated directly onto the useful layer 3. In this case, the useful layer 3 forms the n-side cladding layer 30 or at least one part of the n-side cladding layer.

For relatively long-wave—for example green—laser radiation, the interlayer 2 can form a part of the n-side cladding layer. In this way, the epitaxially grown n-side cladding layer can be kept as thin as possible and thus with the fewest possible defects.

During the production of the edge emitting semiconductor laser chip described in conjunction with FIG. 1A, the chip processing can be carried out after the epitaxy of the layer sequence. If there is a lack of crystal orientation between the epitaxial layers of the component structure 50 and the carrier substrate 1, it is necessary to produce the laser facets by means of a dry-chemical etching process. One advantage of this method is that finished processed devices are present joined together in the wafer and can be tested whilst still joined together in the wafer.

A further method for producing the laser facets consists in undercutting by means of an etching technique for example the interlayer 2 in a targeted manner. In this way, it is possible to produce an overhang and the epitaxially grown layers of the component structure 50 can be fractured. The fracture area then forms the corresponding laser facets of the edge emitting semiconductor laser chip.

The semiconductor laser chip described in conjunction with FIG. 1A is a broad-stripe laser with a strip-type p-contact 8.

In the case of a conductive interlayer 2—for example ITO—, a vertical current path can be used in the device. For this purpose, it is advantageous to bond onto a conductive carrier substrate 1 having a thermal expansion similar to that of the useful layer 3.

Figure 1B:
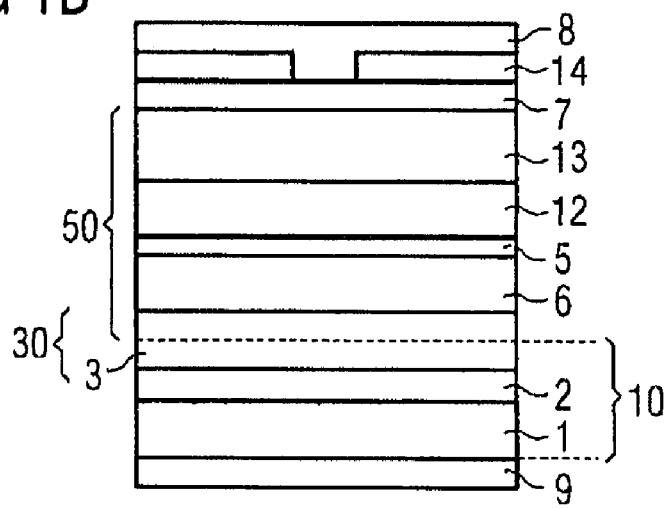
FIG. 1B shows a schematic sectional illustration of an edge emitting semiconductor laser chip in accordance with a second exemplary embodiment.

FIG. 1B shows a schematic sectional illustration of an edge emitting semiconductor laser chip in accordance with a second exemplary embodiment. The semiconductor laser chip described in conjunction with FIG. 1B is an oxide-stripe laser. In contrast to the semiconductor laser chip described in conjunction with FIG. 1A, in the case of this laser an electrically insulating, passivating material 14 is applied to that side of the contact layer 7 which is remote from the active zone 5. An opening is produced in the electrically passivating material 14, said opening being filled with a p-contact material that forms the p-contact 8. An oxide-stripe laser with p-side current path limiting is realized in this way.

Figure 1C:
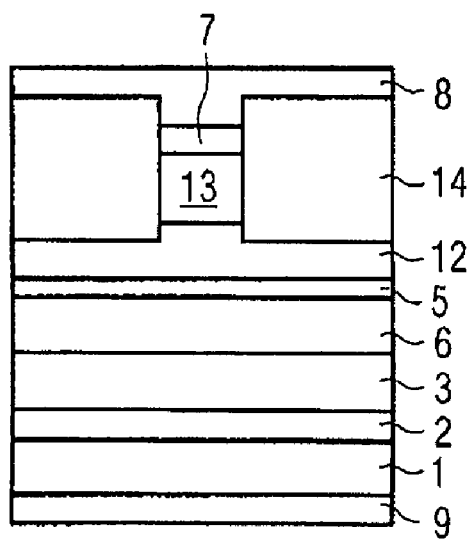
FIG. 1C shows a schematic sectional illustration of an edge emitting semiconductor laser chip in accordance with a third exemplary embodiment.

FIG. 1C shows a schematic sectional illustration of an edge emitting semiconductor laser chip in accordance with a third exemplary embodiment. In contrast to the semiconductor laser chip described in conjunction with FIG. 1A, in the case of this semiconductor laser chip a ridge waveguide structure is patterned, for example etched, into the p-side epitaxial layers of the component structure 50. The ridge waveguide structure is preferably etched as far as the p-side waveguide layer 12. A so-called "ridge waveguide" laser is produced in this way. This variant is particularly well suited to lasers which require not only the high n-side wave-guiding but also a great p-side wave-guiding and current impressing. Details of a "ridge waveguide" laser are provided in the paper "Properties of Ridge-Waveguide" Lasers by M. Mundbrod published in Annual Report 2002, Optoelectronics Department, University of Ulm, the content of which is hereby incorporated by reference.

Figure 2A:
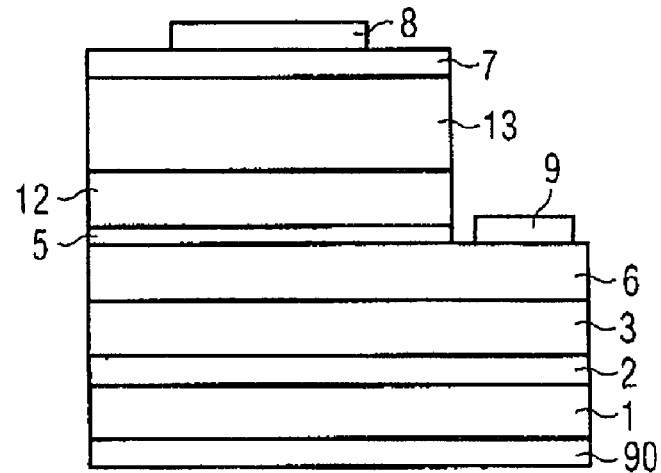
FIG. 2A shows a schematic sectional illustration of an edge emitting semiconductor laser chip in accordance with a fourth exemplary embodiment.

FIG. 2A shows a schematic sectional illustration of an edge emitting semiconductor laser chip in accordance with a fourth exemplary embodiment. In the semiconductor laser chip described in conjunction with FIG. 2A, the interlayer 2 is electrically insulating. For this purpose, the interlayer preferably contains at least one silicon nitride and/or a silicon oxide. By way of example, the interlayer 2 is formed from one of the following materials or contains at least one of the following materials: $SiO_2$, $Si_3N_4$, SiN.

Figure 2B:
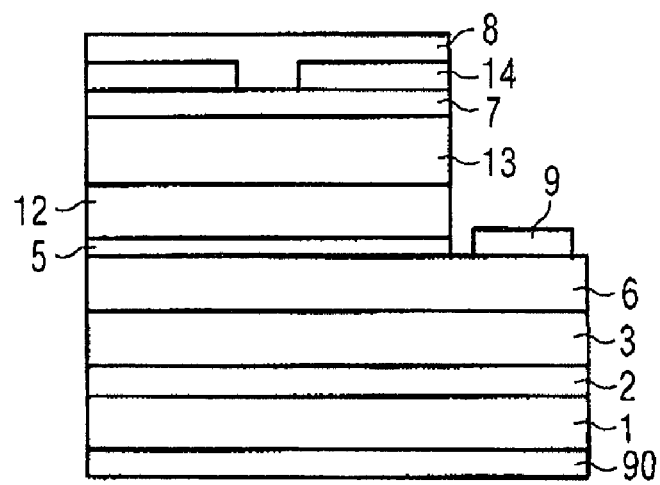
FIG. 2B shows a schematic sectional illustration of an edge emitting semiconductor laser chip in accordance with a fifth exemplary embodiment.
Figure 2C:
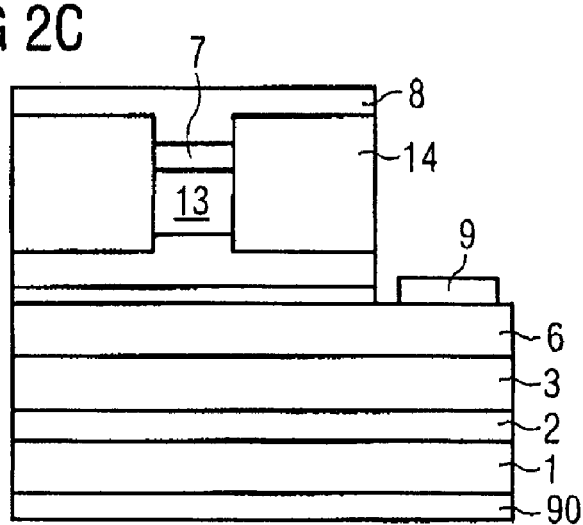
FIG. 2C shows a schematic sectional illustration of an edge emitting semiconductor laser chip in accordance with a sixth exemplary embodiment.

In the case of an electrically insulating interlayer comprising for example a silicon nitride and/or a silicon oxide, it is necessary to process the edge emitting semiconductor laser chip with n- and p-contact on the epitaxially coated side remote from the carrier substrate 1, see FIGS. 2A to 2C.

The starting point for the epitaxy is the lateral cleave process described further above—as described with regard to FIG. 1—for producing a suitable quasi substrate with useful layer 3. The epitaxial structure applied therein corresponds to that for a conductive interlayer 2, although one of the lower cladding or waveguide layers or a specially introduced layer—for example GaN/AlGaN superlattice—must have a high transverse conductivity in order that the n-contact 9 permits homogeneous current impressing into the diode. In this case, the interlayer 2 having a low refractive index can perform wave-guiding tasks of the cladding. The laser diodes processed in this way can again be embodied in the above-mentioned designs broad-stripe laser, FIG. 2A, oxide-stripe laser, FIG. 2B and ridge waveguide laser, FIG. 2C. Here, too, in the case of non-matched carrier orientation, the facet fracturing can be replaced by the etching steps described above.

One advantage of the edge emitting semiconductor laser chip described here is, inter alia, the small total epitaxial layer thickness, the low-defect, crack-free active zone which is only under low thermal loading during operation, and etching steps causing less apparatus time and processing without damage at the epitaxial layers during production. Very good aspect ratios with large aperture angles become possible by virtue of the high degree of wave-guiding.

In contrast to the semiconductor laser described in conjunction with FIG. 1A, in the edge emitting semiconductor laser chip described in conjunction with FIG. 2A, an opening reaching as far as the n-side waveguide layer 6 is produced in the component structure 50. An n-contact 9 is applied to the n-side waveguide layer 6 uncovered in places. In this case, the n-side waveguide layer 6 must have particularly good conductivity and primarily have a high transverse conductivity in order to enable homogenous current impressing into the active zone 5 by means of the n-contact 9. As an alternative to this, a special layer—for example a GaN/AlGaN superlattice layer—having a high transverse conductivity can be introduced between the n-side waveguide layer 6 and the active layer 5.

Furthermore, the interlayer 2 having a low refractive index can perform at least some of the waveguiding tasks of the n-side cladding layer 30. The semiconductor chip can be mechanically fixed on a carrier by means of a connecting layer 90—for example a solder layer.

The semiconductor laser chip described in conjunction with FIG. 2A forms a broad-stripe laser as described in conjunction with FIG. 1A.

FIG. 2B shows a schematic sectional illustration of an edge emitting semiconductor laser chip in accordance with a fifth exemplary embodiment. In contrast to the exemplary embodiment described in conjunction with FIG. 2A, the semiconductor laser chip in FIG. 2B is an oxide-stripe laser as also described in FIG. 1B.

FIG. 2C shows a schematic sectional illustration of an edge emitting semiconductor laser chip in accordance with a sixth exemplary embodiment. In contrast to the semiconductor laser chip described in conjunction with FIG. 2A, the semiconductor laser chip described in conjunction with FIG. 2C is embodied as a "ridge waveguide" laser as already described in conjunction with FIG. 1C.

All of the laser diodes described in conjunction with FIGS. 1A, 1B, 1C and also 2A, 2B and 2C can also be embodied without an n-cladding layer. In this case, the interlayer 2 having a lower refractive index than GaN performs the tasks of the n-cladding layer.

Figure 3A:
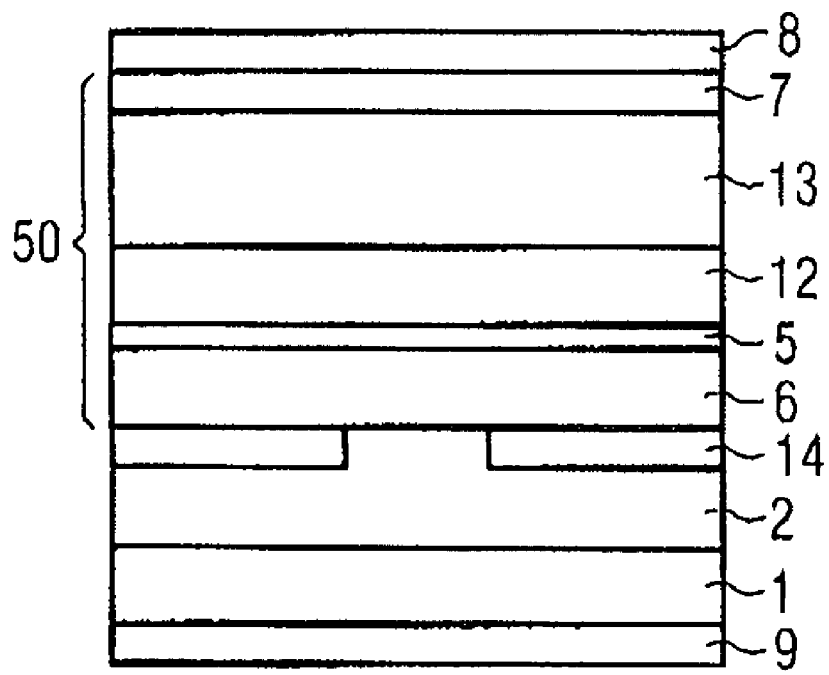
FIG. 3A shows a schematic sectional illustration of an edge emitting semiconductor laser chip in accordance with a seventh exemplary embodiment.

FIG. 3A shows a schematic sectional illustration of an edge emitting semiconductor laser chip in accordance with a seventh exemplary embodiment. The n-cladding layer is dispensed with in this exemplary embodiment. The interlayer 2 directly adjoins the n-waveguide layer 6 of the edge emitting semiconductor laser. A patterning and/or passivation of the cladding layer is possible as a result of the use of the interlayer 2 as cladding layer. By way of example, a passivating material 14—as shown in FIG. 3A—can be introduced at least in places between interlayer 2 and n-waveguide layer 6. The passivation material 14 is for example at least one of the following materials: $SiO_2$, SiN, $Si_3N_4$, GaN, AlGaN. The layer made of passivating material 14 lies particularly close to the n-waveguide layer 6 and also the active zone 5 and thus enables, in interaction with the interlayer 2, a very effective optical confinement and targeted current impressing into the active zone 5. No dry etching steps that cause damage at epitaxial layers are necessary in this case.

In order to realize the semiconductor laser as described in conjunction with FIG. 3A, the component structure 50 is deposited on a low-defect quasi substrate as described further above. The application of the interlayer 2 to the component structure 50 is preceded by a patterning of that side of the n-waveguide layer 6 which is remote from the active zone 5 with the passivating and/or low-refractive-index material 14, into which contact openings are etched. The interlayer 2 is applied to the passivating material 14 and bonded onto the carrier. The subsequent processing is restricted to the application of n-contact 9 and p-contact 8 and the production of the facets according to the method described further above.

The patterning produced in this way enables great electrical and optical confinement. The patterning described here can also be supplemented by a p-side patterning as described for example in conjunction with FIGS. 1B and 1C.

Figure 3B:
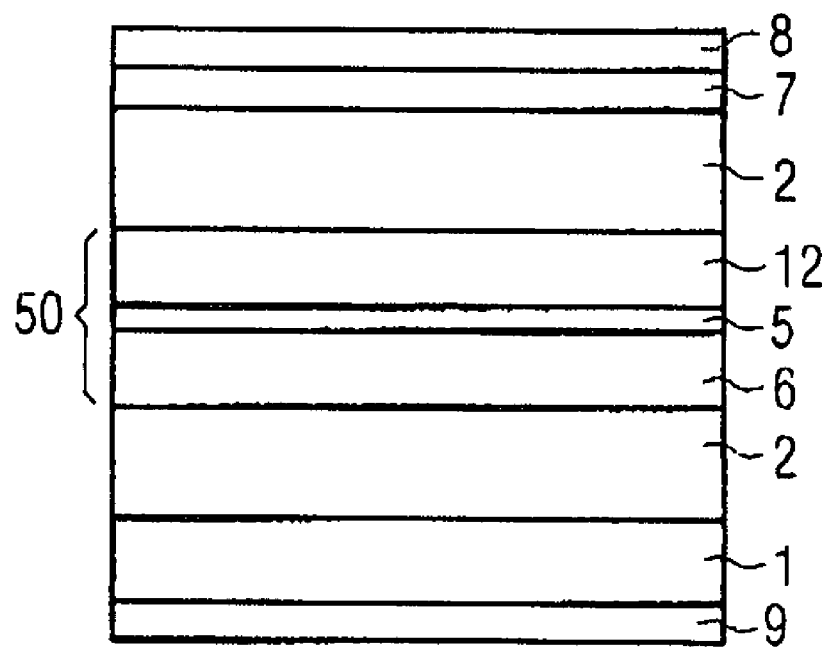
FIG. 3B shows a schematic sectional illustration of an edge emitting semiconductor laser chip in accordance with an eighth exemplary embodiment.

FIG. 3B shows a schematic sectional illustration of an edge emitting semiconductor laser chip in accordance with an eighth exemplary embodiment. In this exemplary embodiment, the semiconductor laser also has a p-side interlayer 2 besides the n-side interlayer 2. In this case, the interlayers 2 can also serve as p- and n-side cladding layers of the semiconductor laser. In order to produce a semiconductor laser of this type, the complete laser epitaxy is carried out on low-defect GaN substrates, the p-side cladding layer being entirely or partly omitted. After the application of the n-side interlayer 2, rebonding onto the carrier substrate 1 is effected and the component structure 50 is stripped from the growth substrate.

Depending on whether a conductive or an electrically insulating n-side interlayer 2 is used, the processing is effected analogously to the methods described in conjunction with FIGS. 1A, 1B, 1C or analogously to the methods described in conjunction with FIGS. 2A, 2B, 2C.

Furthermore, it is possible for the p- and/or n-side interlayers 2 to be patterned as described in conjunction with FIG. 3A.

All of the exemplary embodiments described in conjunction with FIGS. 1A, 1B, 1C, 2A, 2B, 2C, 3A and 3B can also be realized with interchanged p- and n-side of the epitaxial layers and hence interchanged p- and n-contacts.

Figure 4A:
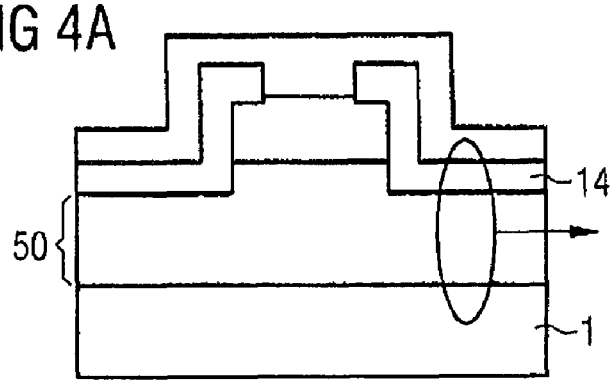
FIG. 4A shows a schematic sectional illustration of an edge emitting semiconductor laser chip in which the electromagnetic radiation is forced into the substrate.

FIG. 4A shows a schematic sectional illustration of an edge emitting semiconductor laser chip in which the electromagnetic radiation—that is to say the optical wave—15 is forced into the substrate 1. The edge emitting semiconductor laser chip here does not have an interlayer as described further above.

Figure 4B:
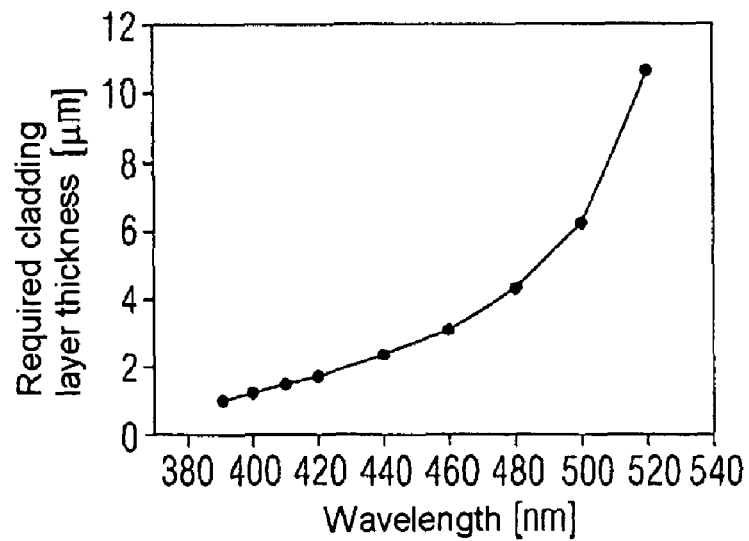
FIG. 4B shows in a plot the required thickness of the cladding layer plotted against the wavelength of the electromagnetic radiation generated in the active zone of the laser in order to suppress substrate modes.

FIG. 4B shows in a plot the required thickness of the cladding layer against the wavelength of the electromagnetic radiation generated in the active zone 5 of the laser in order to suppress substrate modes.

Figure 4C:
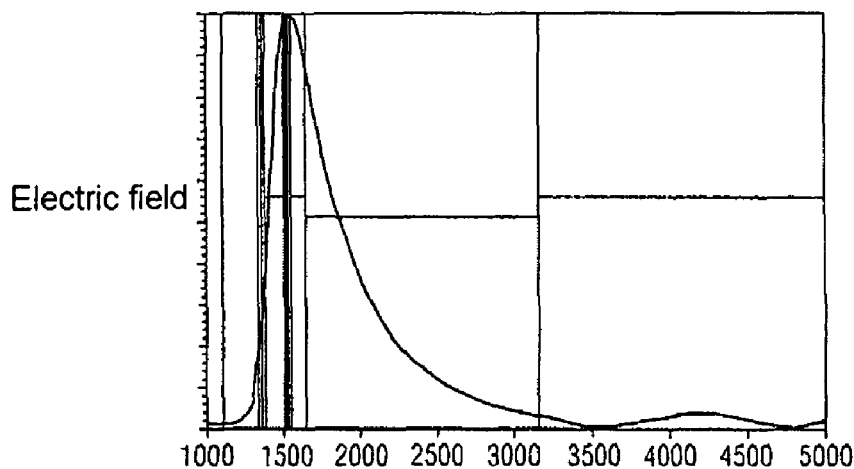
FIG. 4C shows the electric field alongside the ridge of the laser from FIG. 4A.

FIG. 4C shows the electric field in the vicinity of the ridge of the laser from FIG. 4A.

Figure 5A:
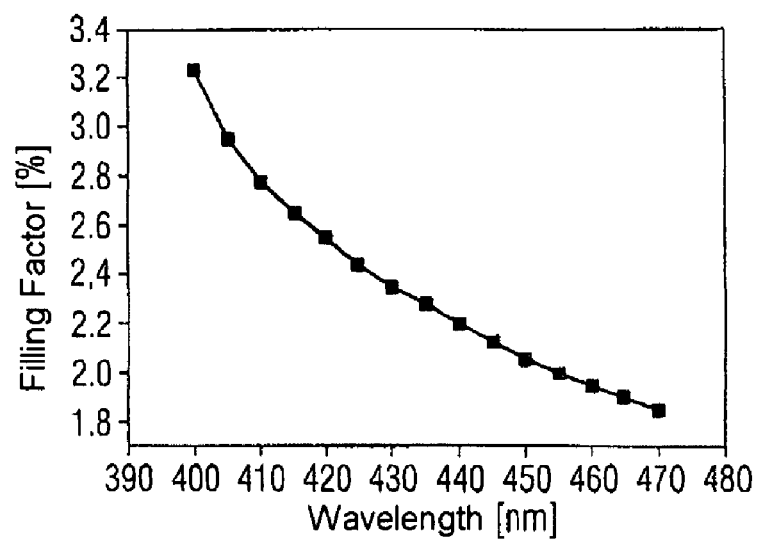
FIG. 5A shows in a plot the filling factor of the laser structure plotted against the wavelength of the electromagnetic radiation generated in the active zone of the laser.

FIG. 5A shows in a plot the filling factor of the laser structure plotted against the wavelength of the electromagnetic radiation generated in the active zone 5 of the laser. As is illustrated in FIG. 5A, the filling factor of the laser structure from FIG. 4A falls owing to the decreasing refractive index contrast as the wavelength of the electromagnetic radiation 15 increases.

Figure 5B:
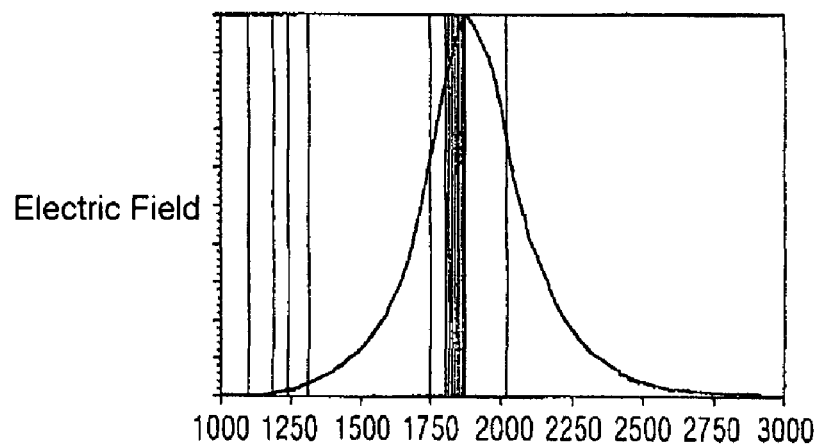
FIGS. 5B and 5C show the electric field analogously to FIG. 4C at 400 nm and at 470 nm.
Figure 5C:
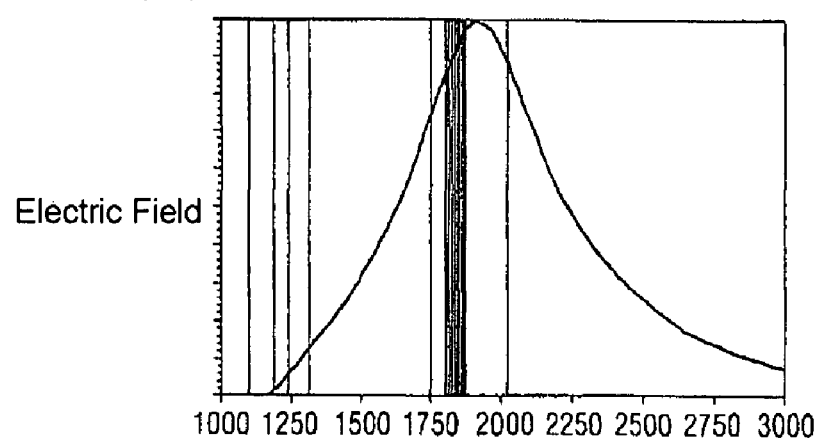

FIGS. 5B and 5C show the electric field analogously to FIG. 4C at a wavelength of the electromagnetic radiation 15 generated in the active zone 5 of the laser of 400 nm and 470 nm, respectively.

Figure 6A:
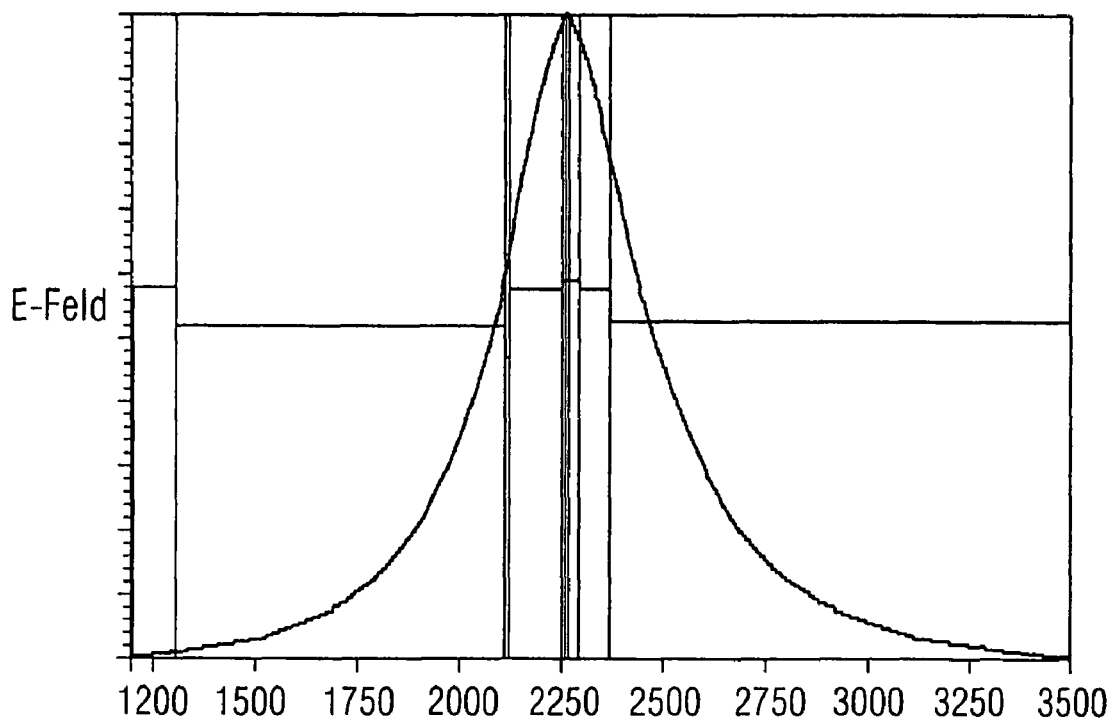
FIG. 6A shows the electric field in the case of a laser as shown in FIG. 4A, with a filling factor of 1.94%.
Figure 6B:
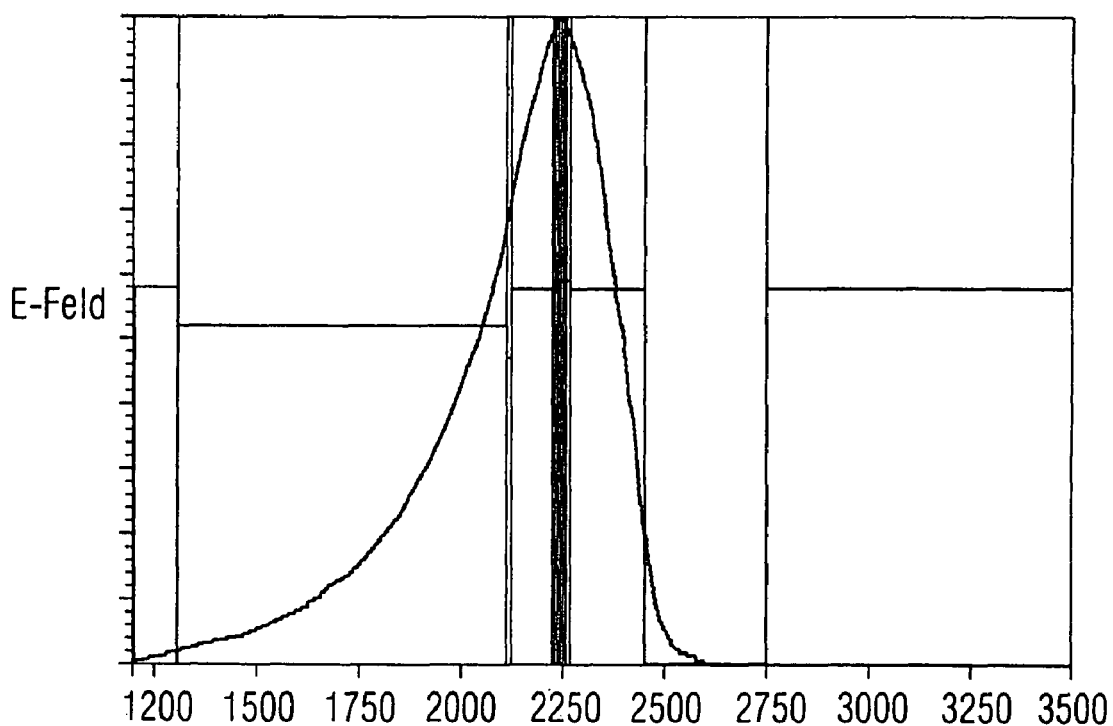
FIG. 6B shows the electric field in the case of a laser as described in conjunction with one of FIG. 1, 2 or 3, with a filling factor of 2.23%.

FIG. 6A shows the electric field in the case of a laser as shown in FIG. 4A, with a filling factor of 1.94%. FIG. 6B shows the electric field in the case of a laser as described in conjunction with one of FIG. 2A, 2B or 3C. An $SiO_2$ interlayer 2 is used in this case. The filling factor is 2.23% in this case. That is to say that the optical wave 15 is guided to a greater extent owing to the great jump in refractive index at the interlayer 2. On account of the interlayer 2, the filling factor of the laser is therefore improved by approximately 15% by comparison with the laser without interlayer 2 as described in conjunction with FIG. 4A.

Overall, it emerges from the considerations made in conjunction with FIGS. 4A, 4B, 4C, 5A, 5B, 5C, 6A, 6B that an interlayer 2 made of a material having a low refractive index at least partly performs the waveguide tasks of a cladding layer and that the filling factor of the active zone can be greatly improved.

The invention is not restricted by the description on the basis of the exemplary embodiments. Rather, the invention encompasses any new feature and also any combination of features, which in particular comprises any combination of features in the patent claims, even if this feature or this combination itself is not explicitly specified in the patent claims or exemplary embodiments.

We claim:

1. An edge emitting semiconductor laser chip comprising:
a carrier substrate;
an epitaxially grown component structure having an active zone for generating radiation; and
a first interlayer being a first bonding layer and being in direct contact with the carrier substrate and the component structure to promote adhesion between the carrier substrate and the component structure;
a second interlayer forming a cladding layer and a second bonding layer and being in direct contact with the component structure and a contact layer;
wherein the first interlayer is an electrically insulating and continuous layer extending completely between the carrier substrate and the component structure such that the carrier substrate does not directly contact the component structure; and
wherein the active zone is located between the first interlayer and the second interlayer.

2. The edge emitting semiconductor laser chip as claimed in claim 1, wherein at least one of the first and second interlayers comprises at least one of the following materials: a silicon oxide, a silicon nitride, an aluminum oxide, a tantalum oxide, and a hafnium oxide.

3. The edge emitting semiconductor laser chip as claimed in claim 1,
wherein the first bonding layer promotes adhesion between the carrier substrate and a useful layer,
wherein at least one part of the component structure is deposited epitaxially onto the useful layer.

4. The edge emitting semiconductor laser chip as claimed in claim 1, further comprising a useful layer, which forms a part of at least one of a further cladding layer and a waveguide layer of the edge emitting semiconductor laser chip.

5. The edge emitting semiconductor laser chip as claimed in claim 1, further comprising a useful layer, wherein a refractive index of a material forming the first interlayer is less than a refractive index of a material forming the useful layer.

6. The edge emitting semiconductor laser chip as claimed in claim 1, further comprising a useful layer, wherein a material which at least one of is electrically insulating and has a smaller refractive index than that of the first interlayer is arranged at places between the first interlayer and the useful layer.

7. The edge emitting semiconductor laser chip as claimed in claim 1, wherein the first interlayer forms a further cladding layer of the edge emitting semiconductor laser chip.

8. The edge emitting semiconductor laser chip as claimed in claim 1, wherein at least one of the first and second interlayers consists of at least one of the following materials: a silicon oxide, a silicon nitride, an aluminum oxide, a tantalum oxide, and a hafnium oxide.

* * * * *